(12) United States Patent
Lee (10) Patent No.: US 6,780,752 B1
(45) Date of Patent: Aug. 24, 2004

(54) METAL THIN FILM OF SEMICONDUCTOR DEVICE AND METHOD FOR FORMING SAME

(75) Inventor: Won Jun Lee, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 314 days.

(21) Appl. No.: 09/717,399

(22) Filed: Nov. 22, 2000

(30) Foreign Application Priority Data

Jul. 22, 2000 (KR) ......................................... 2000-42158

(51) Int. Cl.[7] ......................................... H01L 21/4763
(52) U.S. Cl. ......................................... 438/618; 438/622
(58) Field of Search ............................. 438/627, 643, 438/648, 650, 688, 681, 656, 652, 636, 646, 685, 687, 618–624, 622; 257/762–765, 751

(56) References Cited

U.S. PATENT DOCUMENTS

| 5,391,517 A | * | 2/1995 | Gelatos et al. | 438/628 |
| 5,780,356 A | * | 7/1998 | Kim | 438/627 |
| 5,804,501 A | | 9/1998 | Kim | 438/627 |
| 5,972,179 A | * | 10/1999 | Chittipeddi et al. | 204/192.17 |

* cited by examiner

*Primary Examiner*—Long Pham
*Assistant Examiner*—(Vikki) Hoa B. Trinh
(74) *Attorney, Agent, or Firm*—Jacobson Holman PLLC

(57) ABSTRACT

A metal thin film of a semiconductor device and method for forming the same is disclosed, in which excellent step coverage and surface roughness are maintained. The metal thin film of a semiconductor device according to the present invention includes: a barrier metal layer formed on a semiconductor substrate; and a PVD seed thin film, a CVD thin film, and a PVD reflow thin sequentially formed on the barrier metal layer, wherein the PVD seed thin film, the CVD thin film and the PVD reflow thin film are of the same material.

13 Claims, 15 Drawing Sheets

METAL THIN FILM OF SEMICONDUCTOR DEVICE AND METHOD FOR FORMING SAME

BACKGROUND OF THE INVENTION

1. Field of the Invention

The present invention relates to a semiconductor device, and more particularly, to a metal thin film of a semiconductor device and method for forming the same in which excellent step coverage and surface roughness are maintained.

2. Background of the Related Art

Generally, a method for forming a metal line of a semiconductor device includes two processes such as a tungsten plug+reactive ion etching (RIE) Al process and an Al plug process. In the tungsten plug process, it is possible to even fill a relatively small sized via so as to improve reliability. However, in this case, process steps are relatively complicate and the production cost is high. On the other hand, the Al plug process has advantages that process steps are simple and the production cost is low, but there is a problem that it is difficult for the Al plug process to apply to a microdevice of high packing density.

A related art metal thin film and method for forming a metal line using the same will be described below.

First, a process for forming a metal line using tungsten plug will be described.

FIGS. 1a to 1e are sectional views of a related art process for forming a metal line using tungsten plug.

Figure 1A:
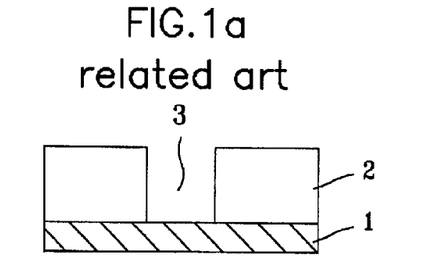
FIGS. 1a to 1e are sectional views of a related art process for forming a metal line using tungsten plug.

As shown in FIG. 1a, an interleaving insulating film 2 is formed on a semiconductor substrate 1 and then selectively etched to form a contact hole 3.

Figure 1B:
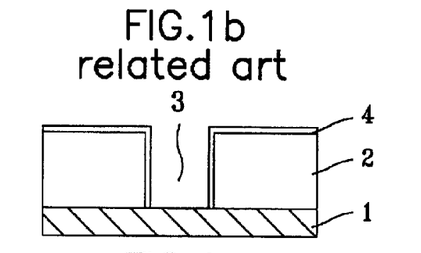

Subsequently, as shown in FIG. 1b, a thin barrier metal layer 4 is formed on an entire surface of the semiconductor substrate 1 including the contact hole 3.

Figure 1C:
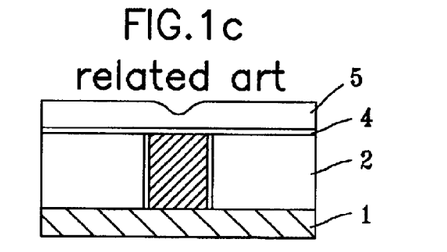

As shown in FIG. 1c, blanket tungsten W is deposited on the contact hole 3 on which the barrier metal layer 4 is formed, by chemical vapor deposition (CVD) process to completely fill the contact hole 3. Thus, a material layer for the formation of plug, i.e., a tungsten layer 5 is formed. At this time, the tungsten layer 5 fills the contact hole 3 and is also formed on the interleaving insulating film 2.

Figure 1D:
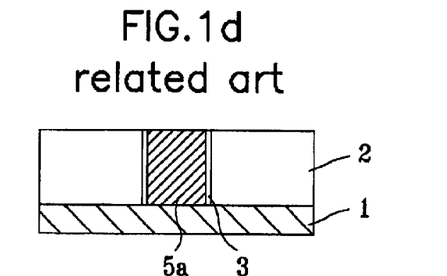

Afterwards, as shown in FIG. 1d, the tungsten layer 5 is planarized by chemical mechanical polishing (CMP) process or etch-back process to form a plug layer 5a.

Figure 1E:
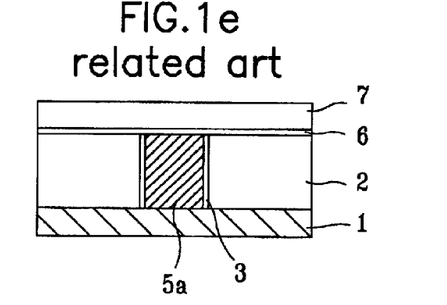

Finally, as shown in FIG. 1e, an anti-reflective coating (ATC) layer 6 and an Al layer 7 are deposited on the entire surface on which the plug layer 5a is formed. Thus, a metal line is formed.

The aforementioned process for forming a metal line using tungsten plug has advantages that currently used equipments are used as they are and that the process technology tested and verified by actual mass production is used. However, the production cost is high ($14.36/wf) and a lot of process steps are required, thereby reducing yield. Also, since blanket deposition process is used, it is likely that void occurs if the size of the contact hole becomes smaller.

Now, a process for forming a metal line using Al reflow will be described.

FIGS. 2a to 2d are sectional views of a related art process for forming a metal line using Al reflow.

Figure 2A:
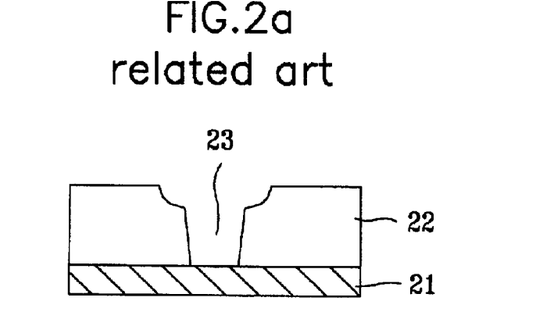
FIGS. 2a to 2d are sectional views of a related art process for forming a metal line using Al reflow.

As shown in FIG. 2a, an interleaving insulating film 22 is formed on a semiconductor substrate 21 and then selectively etched to form a contact hole 23. The contact hole 23 has a wine glass type of which corner portions are rounded, so as to improve filling efficiency of a material for the formation of plug.

Figure 2B:
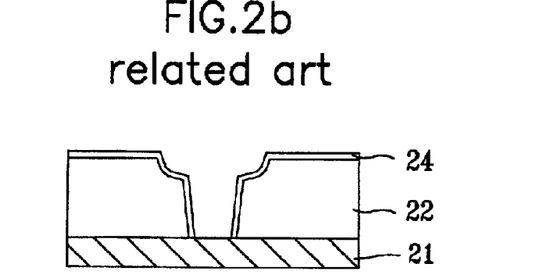
Figure 2C:
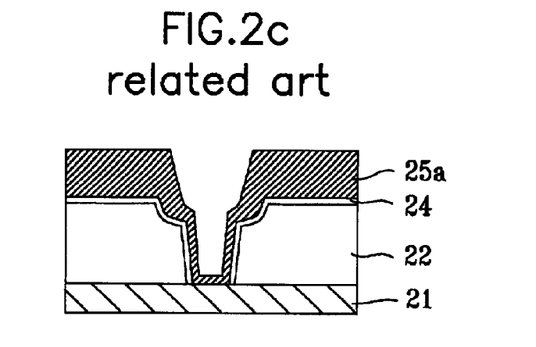

Subsequently, as shown in FIG. 2b, a barrier layer and a wetting layer 24 are formed on a surface of the interleaving insulating film 22 including bottom and wall of the contact hole 23. As shown in FIG. 2c, an Al layer 25 is formed by physical vapor deposition (PVD) process. At this time, the Al layer 25 does not completely fill the contact hole 23 but partially fills the contact hole 23 due to characteristic of the PVD process.

Figure 2D:
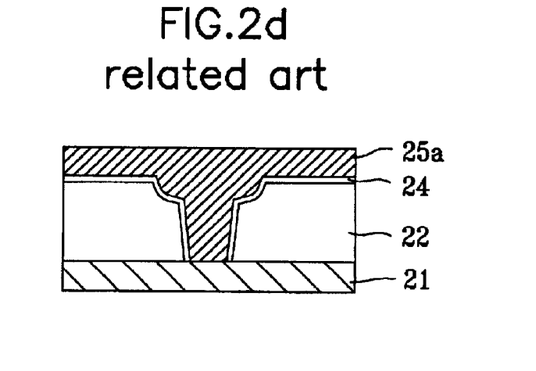

Afterwards, as shown in FIG. 2d, the Al layer 25 is reflowed by annealing process at a temperature of 550° C. or greater, and then is planarized to completely fill the contact hole 23. Thus, a metal line layer 25a of plug+main line structure is formed.

The aforementioned process for forming a metal line using Al reflow has an advantage that the production cost is low. However, there are problems that additional process for forming a contact hole having a shape capable of being filled is required, and aspect ratio of the contact hole is limited. Also, there are still problems that high temperature and low vacuum equipment is required, and line resistance may increase due to high temperature process.

Another related art method for forming a metal line using Al cold-hot deposition will be described with reference to FIGS. 3a to 3d.

FIGS. 3a to 3d are sectional views of a related art process for forming a metal line using Al cold-hot deposition.

Figure 3A:
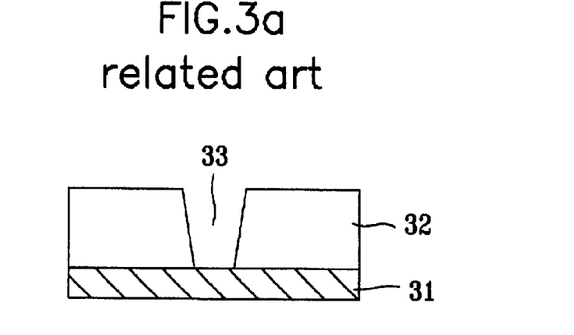
FIGS. 3a to 3d are sectional views of a related art process for forming a metal line using Al cold-hot deposition.

As shown in FIG. 3a, an interleaving insulating film 32 is formed on a semiconductor substrate 31 and then selectively etched to form a contact hole 33. The contact hole 33 has a greater top width than a bottom width, so as to improve filling efficiency of a material for the formation of plug.

Figure 3B:
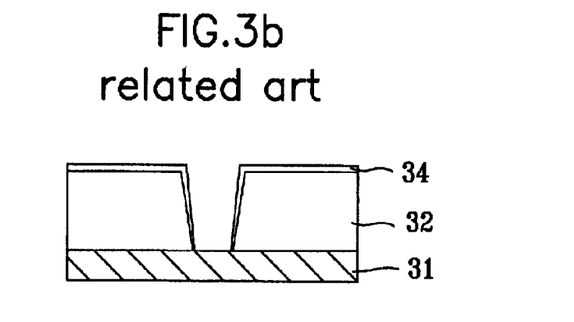
Figure 3C:
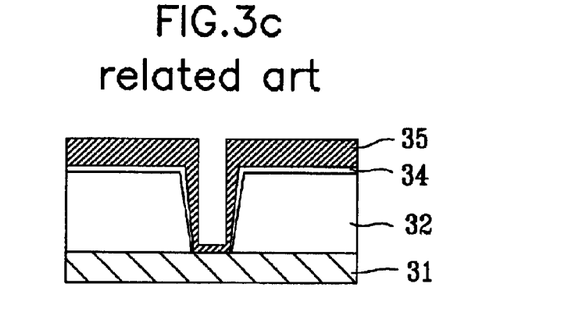

Subsequently, as shown in FIG. 3b, a barrier layer and a wetting layer 34 are formed on a surface of the interleaving insulating film 32 including bottom and wall of the contact hole 33. As shown in FIG. 3c, a cold Al layer 35 is formed on the barrier layer and the wetting layer 34.

Figure 3D:
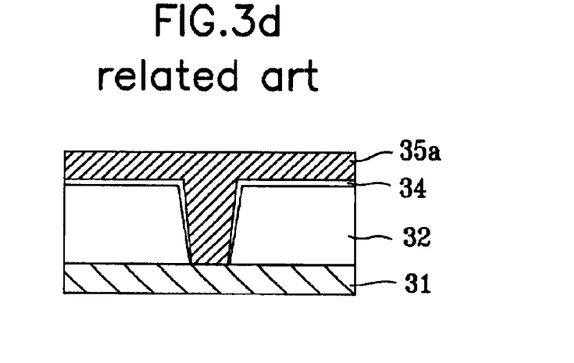

Afterwards, as shown in FIG. 3d, a hot Al layer 35a is formed at a temperature of 400~550° C. to form a metal line layer of plug+main line structure.

The aforementioned process for forming a metal line using Al cold-hot deposition has advantages that no additional equipment is required because the number of process steps is small and thus the production cost is low. However, there is a problem that aspect ratio of the contact hole is limited. Also, there is a problem that line resistance may increase because relatively high temperature process is required.

Another related art method for forming a metal line using CVD/PVD Al will be described with reference to FIGS. 4a to 4d.

FIGS. 4a to 4d are sectional views of a related art process for forming a metal line using CVD/PVD Al.

Figure 4A:
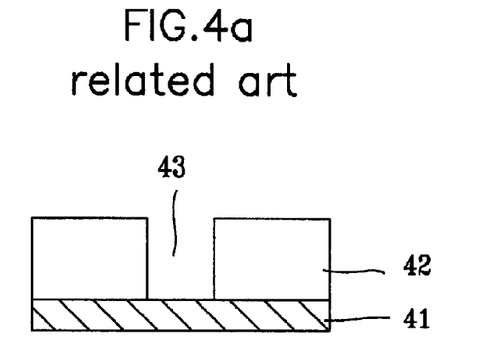
FIGS. 4a to 4d are sectional views of a related art process for forming a metal line using CVD/PVD Al.

As shown in FIG. 4a, an interleaving insulating film 42 is formed on a semiconductor substrate 41 and then selectively etched by Ar sputtering process to form a contact hole 43.

Figure 4B:
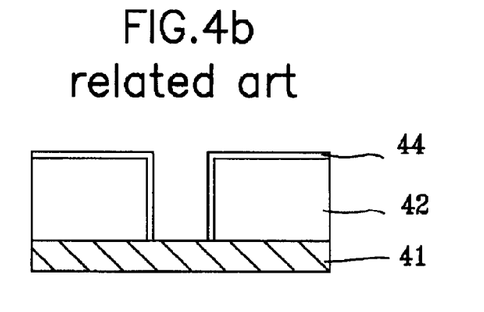

Subsequently, as shown in FIG. 4b, a barrier layer and a nucleation layer 44 are formed on an upper surface of the interleaving insulating film 42 including bottom and wall of the contact hole 43. The barrier layer is formed by depositing Ti TiN or Ti/TiN by ionized PVD or CVD process.

Figure 4C:
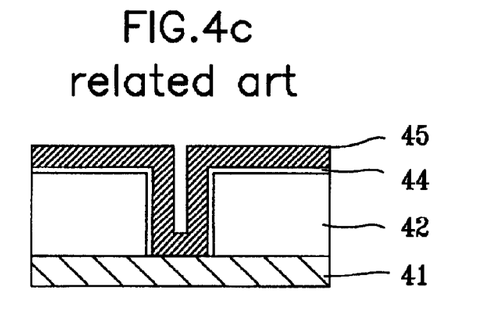

As shown in FIG. 4c, a CVD Al layer 45 is formed on an entire surface on which the barrier layer and the wetting layer 44 are formed, at a thickness of 1000 Å or less by CVD process.

Figure 4D:
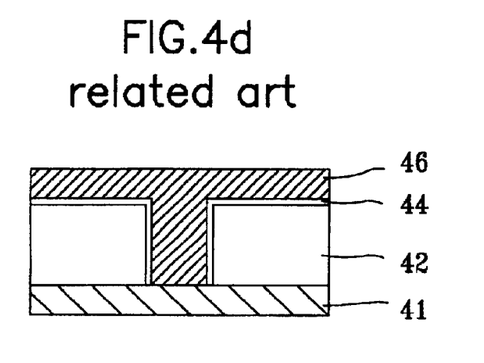

Afterwards, as shown in FIG. 4d, a PVD Al layer 46 is formed on the CVD Al layer 45 by performing PVD process at a temperature of 350~400° C. to form a plug layer and a main line layer. The CVD Al layer 45 is used as the wetting layer required for reflow of the PVD Al layer 46. Al is deposited on the CVD Al layer 45 at a relatively high temperature and low power of 5 kW or less by PVD process, so that reflow occurs.

To improve accuracy of a subsequent patterning process, an ARC layer may be formed on the PVD Al layer 46. Ti/TiN may be used as the ARC layer.

IMP Ti/MOCVD TiN is mainly used as a metal for forming the barrier layer during the PVD/CVD Al line process, due to its excellent via filling characteristic.

The metal deposition by CVD process used in the process for forming a metal line has more excellent via filling characteristic than the PVD reflow and thus many researches using CVD have progressed in Al plug process of a next generation device. Particularly, deposition speed of the aforementioned process using PVD/CVD Al is higher than deposition speed by CVD process only, and an alloying element can be added so that a metal line having high productivity and high reliability can be fabricated. However, there is a problem that IMP Ti/MOCVD TiN mainly used as the barrier metal due to excellent via filling characteristic has a poor surface texture of a metal thin film closely related to electromigration resistance, and for this reason, reliability of the metal line is not better than IMP Ti.

SUMMARY OF THE INVENTION

Accordingly, the present invention is directed to a metal thin film of a semiconductor device and method for forming the same that substantially obviates one or more of the problems due to limitations and disadvantages of the related art.

An object of the present invention is to provide a metal thin film of a semiconductor device and method for forming the same in which excellent step coverage and surface roughness are maintained.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a metal thin film of a semiconductor device according to the present invention includes: a barrier metal layer formed on a semiconductor substrate; and a PVD seed thin film, a CVD thin film, and a PTD reflow thin film sequentially formed on the barrier metal layer, wherein the PVD seed thin film, the CVD thin film and the PVD reflow thin film are of the same material.

In another aspect, a method for forming a metal thin film of a semiconductor device according to the present invention includes the steps of: forming an interleaving insulating film on a semiconductor substrate and selectively etching the interleaving insulating film to form a contact hole; forming a barrier metal layer on the interleaving insulating film including the contact hole; forming a PVD seed thin film on the barrier metal layer; forming a CVD thin film on the PVD seed thin film; and forming a PVD reflow thin film on the CVD thin film to fill the contact hole and form a flat thin film on the interleaving insulating film.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 5:
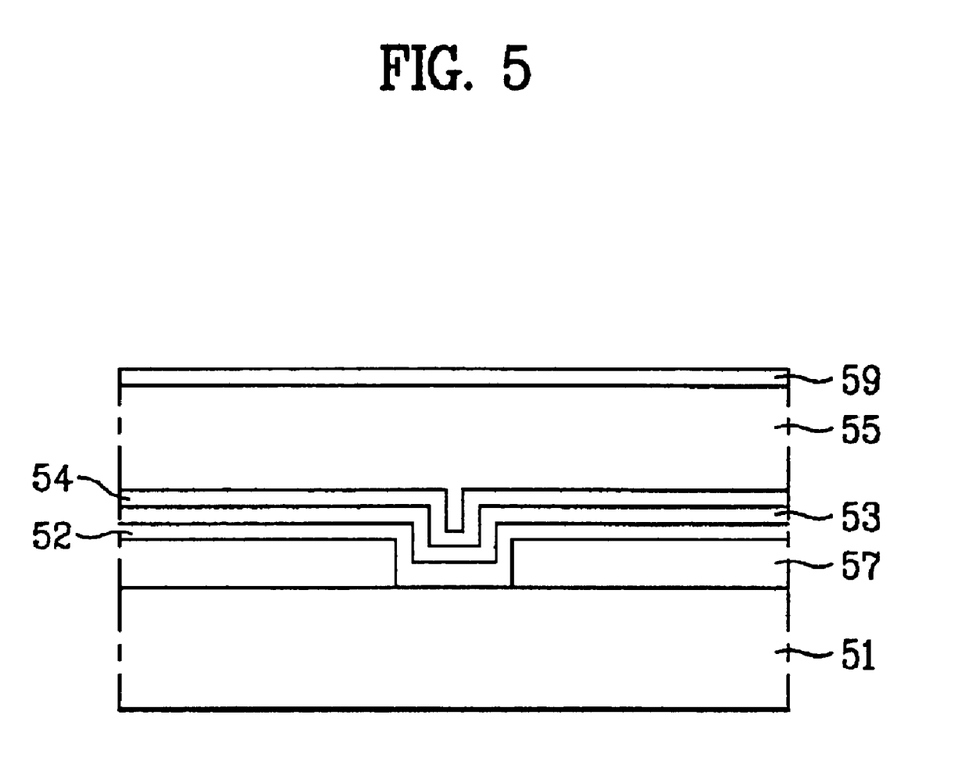
FIG. 5 is a sectional view of a metal thin film according to the present invention.
Figure 6A:
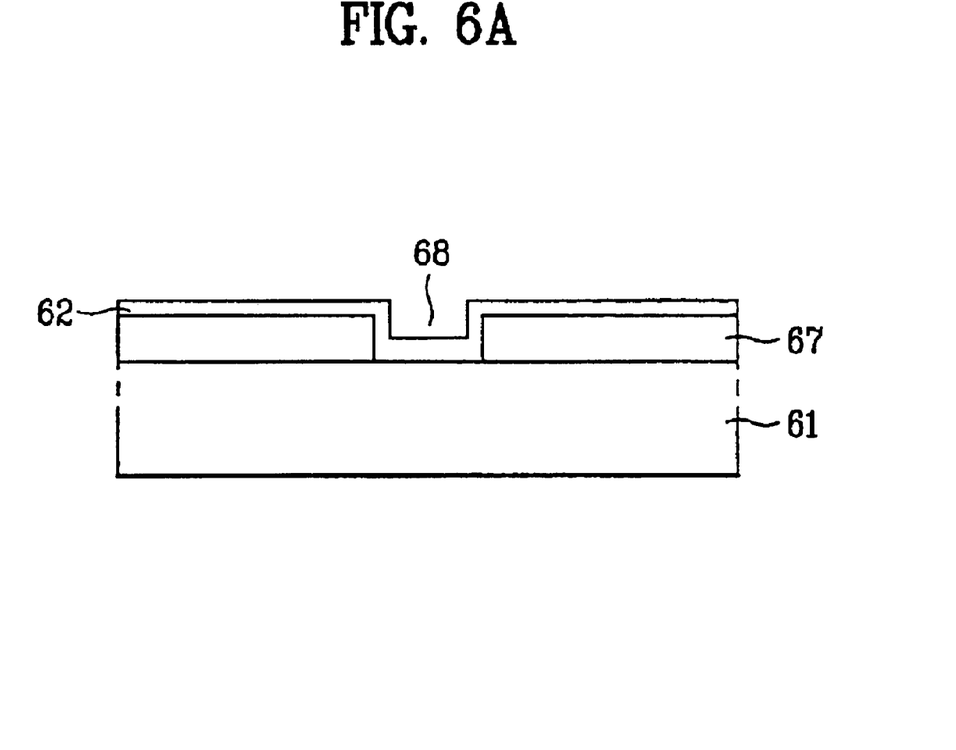
FIG. 6 is a sectional view of a process for forming the metal thin film according to the present invention.
Figure 6B:
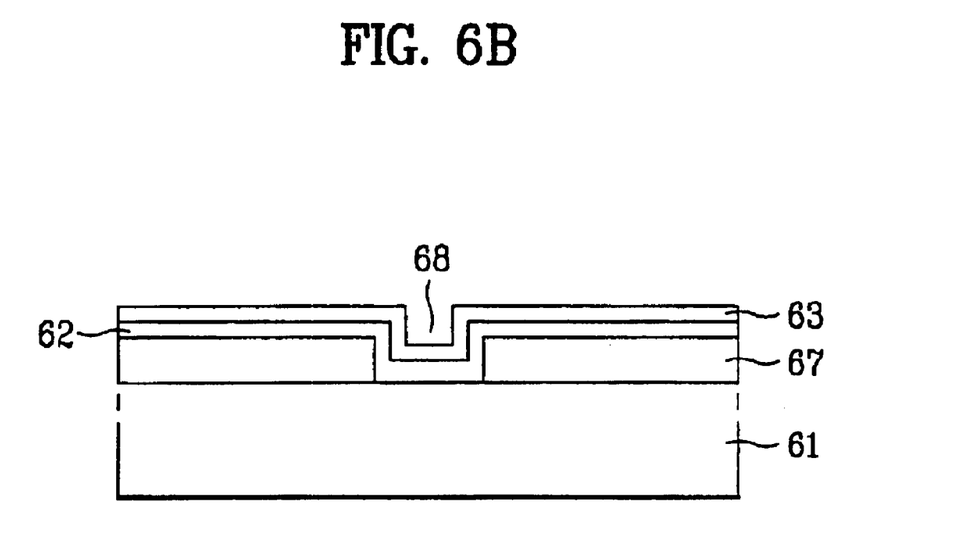
Figure 6C:
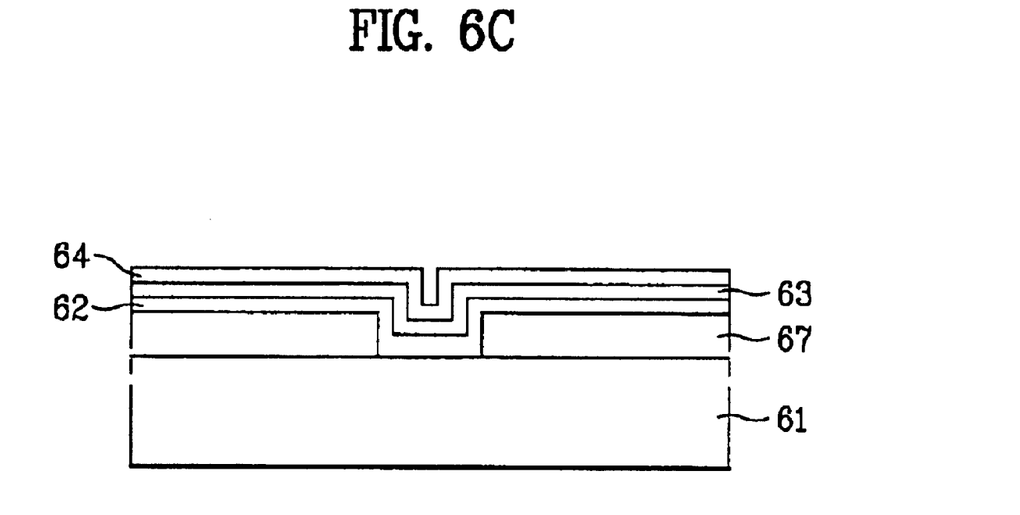
Figure 6D:
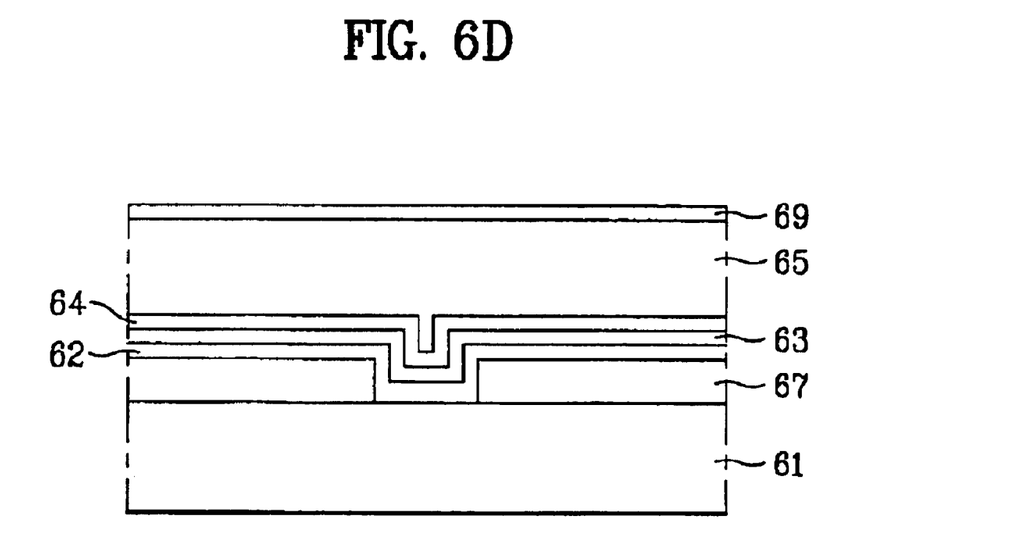

FIG. 5 is a sectional view of a metal thin film according to the present invention.

A metal thin film according to the present invention includes a barrier metal layer 52 formed on a semiconductor substrate 51 including an interleaving insulating film 57, and a PVD seed thin film 53, a CVD thin film 54, a PVD reflow thin film 65 sequentially formed on the barrier metal layer 52. The barrier metal layer 52 is of Ti, TiN, or Ti/TiN, wherein Ti is formed by IMP process and TiN is formed by metal-organic chemical vapor deposition (MOCVD) process. Also, the barrier metal layer 52 may be of IMP Ti or IMP Ti/TiN. The PVD seed thin film 53, the CVD thin film 54 and the PVD reflow thin film 65 are of the same material such as Al or Cu.

The aforementioned metal thin film according to the present invention can allow nuclei formation of the CVD thin film 54 and improve its fine structure by depositing the PVD seed thin film 53 between the barrier metal layer 52 and the CVD thin film 54. In other words, to solve problems related to nuclei formation and fine structure of Al, an Al <111> thin film useful for nuclei formation and growth of CVD Al is formed as a seed layer by PVD process, and then a later process is formed.

Meanwhile, an ARC layer 59 of Ti/TiN may further be formed on the PVD reflow thin film 55.

A method for forming the aforementioned thin film according to the present invention will be described below.

FIG. 6 is a sectional view of a process for forming the metal thin film according to the present invention.

As shown in FIG. 6, a barrier metal layer 62 is formed on a semiconductor substrate 61 in which an interleaving insulating film (oxide film) 67 including a contact hole 68 in a particular portion is formed. To ensure cleanness of the contact hole 68, cleaning process is performed using plasma before the barrier metal layer 62 is formed.

As shown in FIG. 6, a process for forming a plug layer is performed. Namely, a PVD seed thin film 63 is formed on the barrier metal layer 62 as a seed layer. The PVD seed thin film 63 is formed of Al or Cu with a thickness of 2000 Å or less at a low temperature of 300° C. or less and high power of 5 kW or greater.

Subsequently, as shown in FIG. 6, a CVD thin film 64 is formed on the PVD seed thin film 63 at a thickness of 1000 Å or less. The CVD thin film 64 is of AL and an organic metal compound, such as dimethyl aluminum hydride DMAH), $(CH_3)_2AlH$, dimethyl ethyl amine alane PMEAA) and $AlH_3N(CH_3)_2(C_2H_5)$), or a blend material containing the organic metal compound is used as a precursor of the CVD thin film 64.

The CVD thin film 64 may be formed at a deposition temperature of 150~300° C. and a deposition pressure of 1~100 Torr using a blend material in which adduct of a small amount is added to DMAH.

In case where the CVD thin film 64 is of Cu, Lewis-base stabilized Cu(I)beta-diketonate or a blend material containing it is used as a precursor. The CVD tin film 64 may be formed at a deposition temperature of 100~300° C. and a deposition pressure of 1~100 Torr using a blend material in which tmvs and Hhfac Dihydrate (HDH) are added to Cu(hfac)(tmvs) as a blend precursor.

In case where the CVD thin film 64 is formed of Al, the barrier metal layer 62 is formed of Ti, TiN, or Ti/TiN, wherein Ti is deposited by ionized PVD process and TIN is deposited by ionized PVD or CVD process. In case where the CVD thin film 64 is formed of Cu, the barrier metal layer 62 is formed of Ta, TaN, Ta/TaN, TiN, Ti/TiN or Wnx, wherein Ta and Ti are deposited by ionized PVD process while Tan, TiN and Wnx are deposited by ionized PVD or CVD process.

As shown in FIG. 6, a PVD reflow thin film 65 is formed on the CVD thin film 64. At this time, in case where the PVD reflow thin film 65 is formed of Al, a deposition process is performed at a temperature of 300° C. or greater (preferably, 350~400° C.) and power of 5 kW or less or power of 5 kW or greater. Then, a subsequent annealing process is performed. Alternatively, high power of 5 kW or greater and low power of 5 kW or less are used in turn.

In case where the PVD reflow thin film 65 is formed of Cu, a deposition process is performed at a temperature of 300° C. or greater (preferably, 350~400° C.) and power of 5 kW or less or power of 5 kW or greater. Then, a subsequent annealing process is performed. Alternatively, high power of 5 kW or greater and low power of 5 kW or less are used in turn.

The PVD reflow thin film 65 has a thickness less than 50% of the final thickness of the overall thin films.

Additionally, to improve accuracy of a subsequent patterning process, an ARC layer 69 of Ti/TiN may be formed on the PVD reflow thin film 65.

In the aforementioned method for forming a metal thin film according to the present invention, the CVD thin film is deposited on the PVD seed thin film so as to improve nuclei formation and fine structure as compare with the case where the CVD thin film is deposited on the barrier metal layer.

When forming the CVD thin film, DMAH, $(CH_3)_2AlH$, DMEAA and $AlH_3N(CH_3)_2(C_2H_5)$) which may be used as a precursor have selectivity in which deposition speed is high on a conductive substrate such as metal while deposition does not almost occur on a nonconductive substrate such as oxide film.

In case of a metal substrate, of course, growth speed and fine structure of the CVD thin film may be varied depending on kinds of metal and process conditions.

In view of reliability of a metal line, the most preferred metal line fine structure is a thin film uniformly aligned in <111> direction and thus it is important to select a substrate which allows the CVD thin film to be aligned in <111> direction.

Generally, in case of PVD Al, a Ti thin film aligned in <002> direction is known as the most excellent barrier metal layer in view of alignment of Al thin film. Ti<002>/TN<111>thin film is also known as an excellent barrier metal layer. Nonetheless, it is difficult to obtain excellent nuclei formation and alignment characteristic equivalent to the case where the CVD thin film is formed on the PVD thin film of the same material as the CVD film.

Particularly, the method for forming a metal thin film according to the present invention has advantages that, in even case where IMP Ti/MOCVD TiN barrier known as the barrier metal layer having the most excellent Al filling characteristic is used, problems related to Al nuclei formation and fine structure can be solved by forming the IMP Ti/MOCVD TiN barrier on the PVD seed thin film.

Characteristics of CVD/PVD Al thin film for both IMP Ti and IMP Ti/MOCVD TiN barrier will be described below.

Figure 7A:
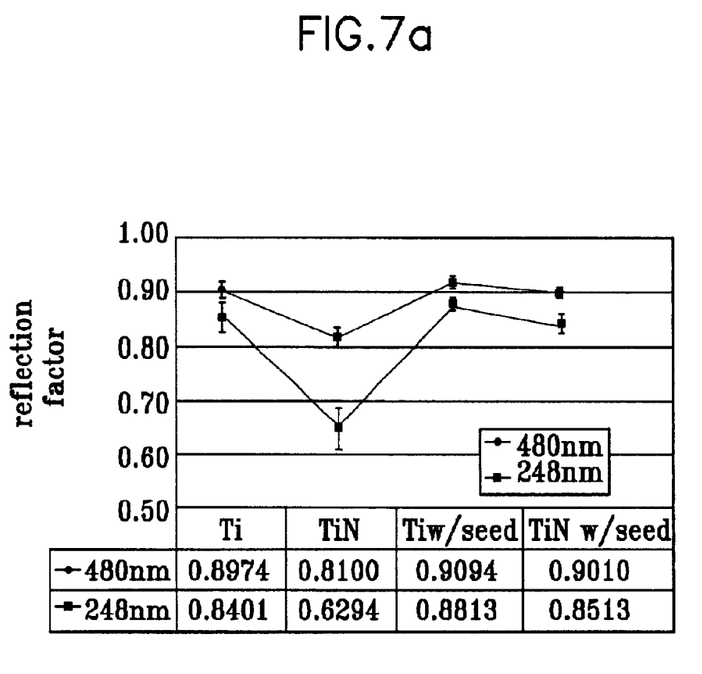
FIGS. 7a to 7b show characteristic graphs showing reflection factor and surface roughness of a CVD/PVD Al thin film according to a barrier metal.
Figure 7B:
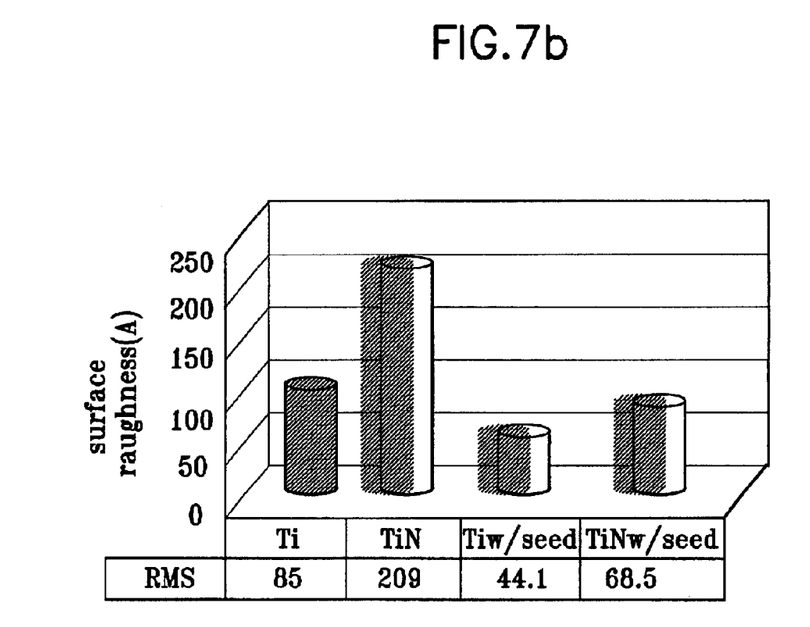

FIGS. 7a to 7b show characteristic graphs showing reflection factor and surface roughness of a CVD/PVD Al thin film according to a barrier metal.

Referring to FIGS. 7a and 7b, in reflection factor and surface roughness of the CVD/PVD Al thin film, it is noted that reflection factor is lower and surface roughness is greater on the Ti/TiN barrier than the Ti barrier when the PVD Al seed is not applied. However, in case where the PVD seed thin film is applied in the same manner as the present invention, it is noted that reflection factor and surface roughness are improved in case of both the Ti and Ti/TiN barriers. Particularly, it is noted that reflection factor and surface roughness are improved in case of Ti/TiN barrier.

In FIG. 7a and 7b, Ti denotes IMP Ti Ti/TiN denotes IMP Ti/MOCVD TiN, and seed denotes PVD Al seed layer.

FIGS. 8a to 8d are AFM images showing surface morphologies of the CVD/PVD Al thin film according to the barrier metal.

Referring to FIGS. 8a to 8d, it is noted that a surface morphology becomes smooth in case where the PVD see thin film is used. Particularly, it is noted that a surface morphology remarkably becomes smooth in case where the Ti/TiN barrier is used and the PVD Al seed layer of the present invention is formed.

Figure 8A:
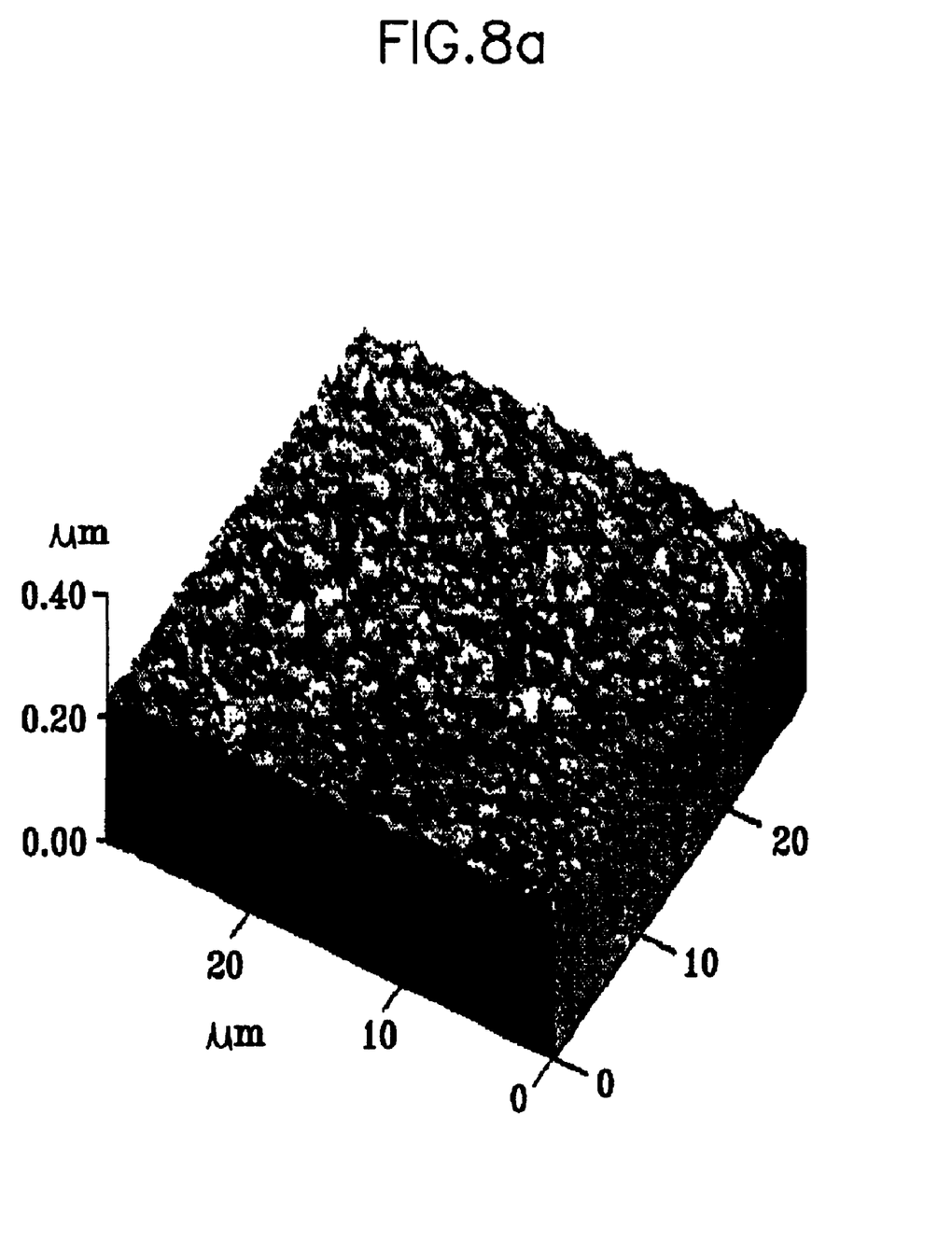
FIGS. 8a to 8d are AFM images showing surface morphologies of the CVD/PVD Al thin film according to the barrier metal.
Figure 8B:
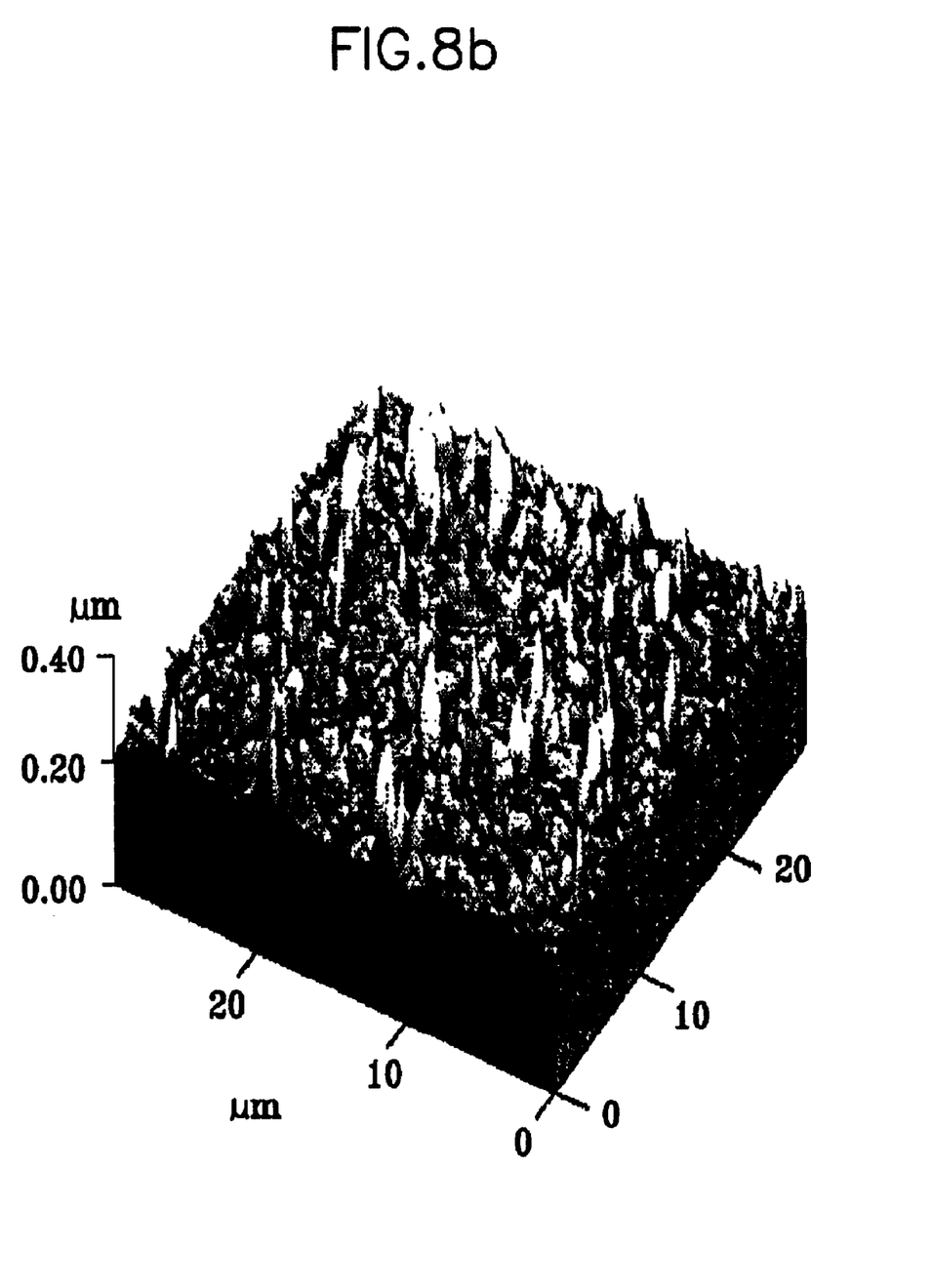
Figure 8C:
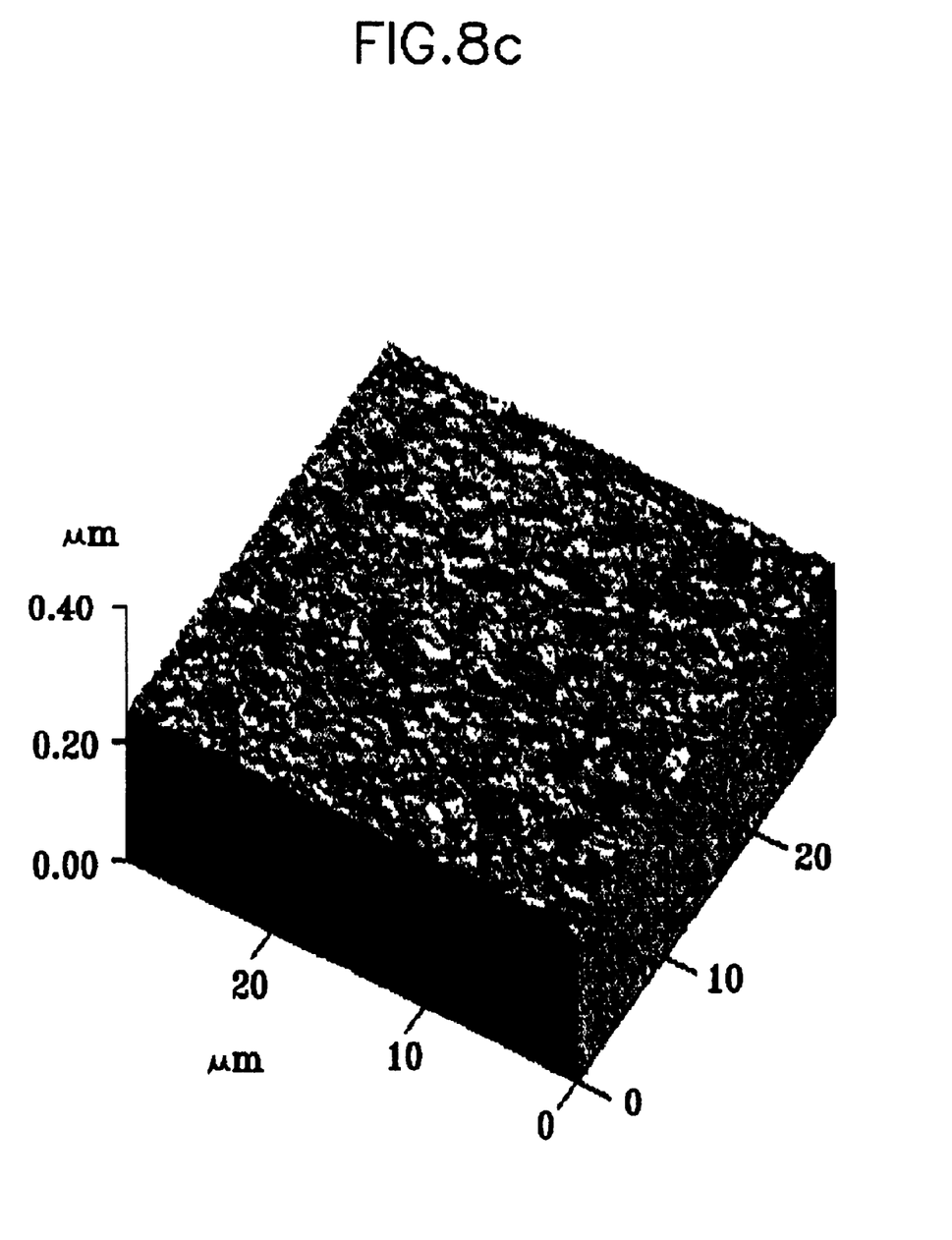
Figure 8D:
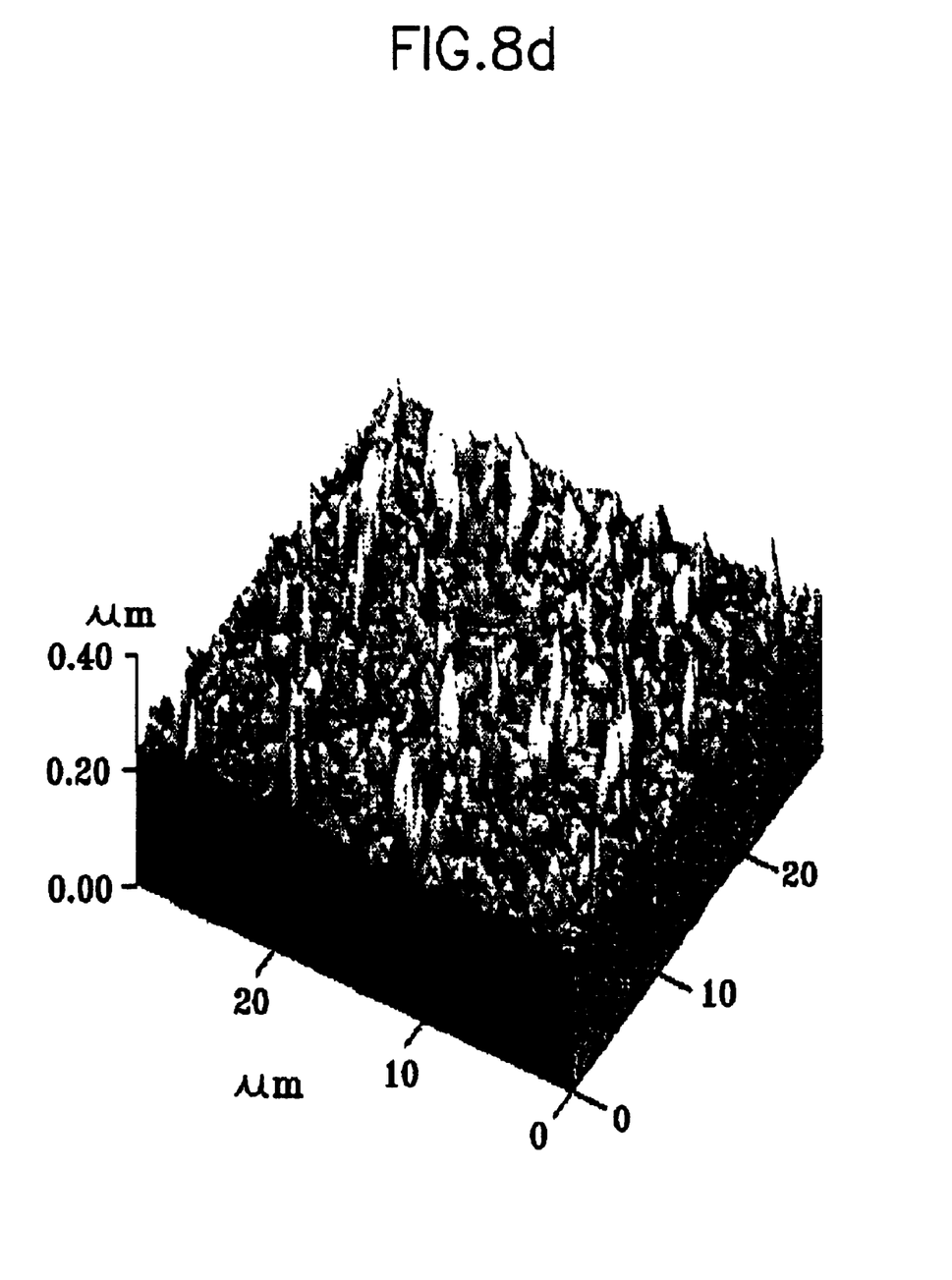

In more detail, FIG. 8a shows a surface morphology of the CVD/PVD Al thin film in case of IMP Ti barrier, FIG. 8b shows a surface morphology of the CVD/PVD Al thin film in case of IMP Ti/MOCVD TiN barrier, FIG. 8c shows a surface morphology of the Al thin film in case of IMP Ti barrier and PVD Al seed layer, and FIG. 8d shows a surface morphology of Al thin film in case of IMP Ti/MOCVD TiN barrier and the PVD Al seed layer.

Figure 9A:
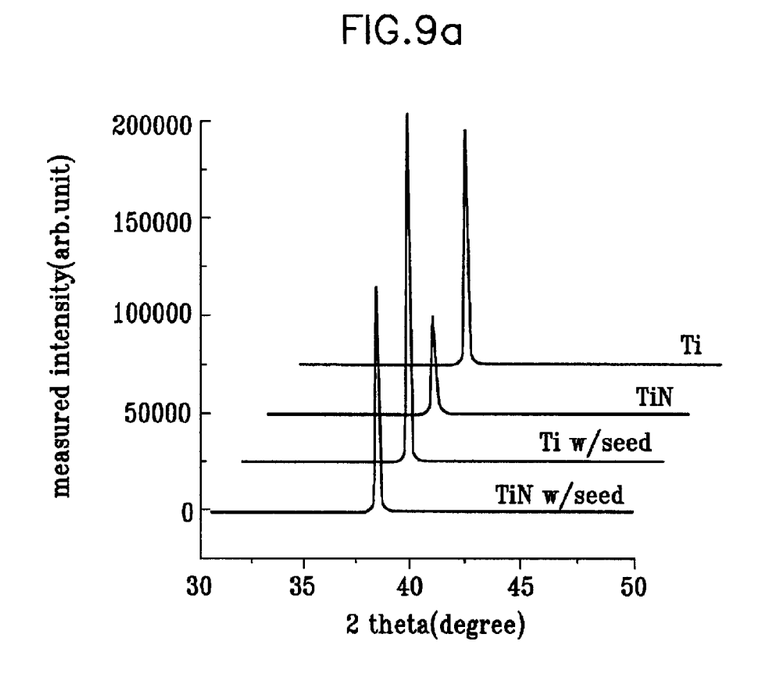
FIGS. 9a and 9b are XRD pattern and rocking curve of the CVD/PVD Al thin film according to the barrier metal.
Figure 9B:
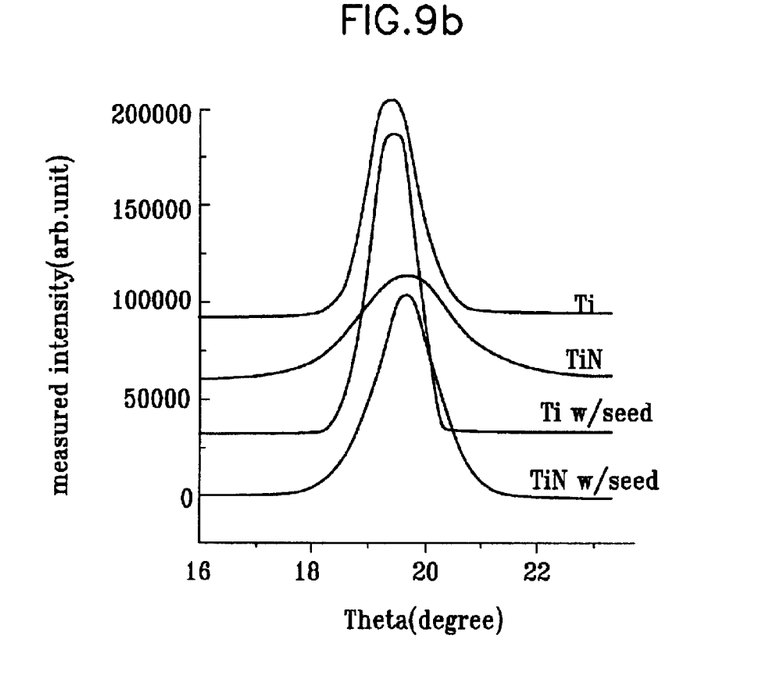

FIGS. 9a and 9b show XRD patterns obtained by each sample. Referring to FIGS. 9a and 9b, it is noted that Theta-2theta scan and Al<111> rocking curve show excellent <111> surface texture in Ti rather than Ti/TiN. It is also noted that a surface texture of the Al thin film becomes excellent by the PVD Al seed layer.

FIGS. 10a to 10d are graphs showing via filling characteristic through via distribution. Referring to FIGS. 10a to 10d, four samples of thin films are applied to Al plug formation process of two-level metallization process and thus via resistance distribution is obtained.

Figure 10A:
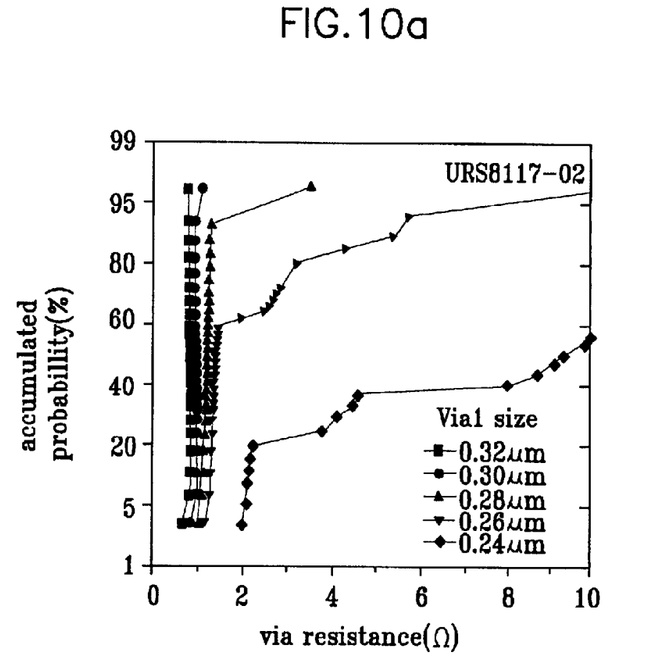
FIGS. 10a to 10d are graphs showing via filling characteristic of a CVD/PVD Al process according to the barrier metal.
Figure 10B:
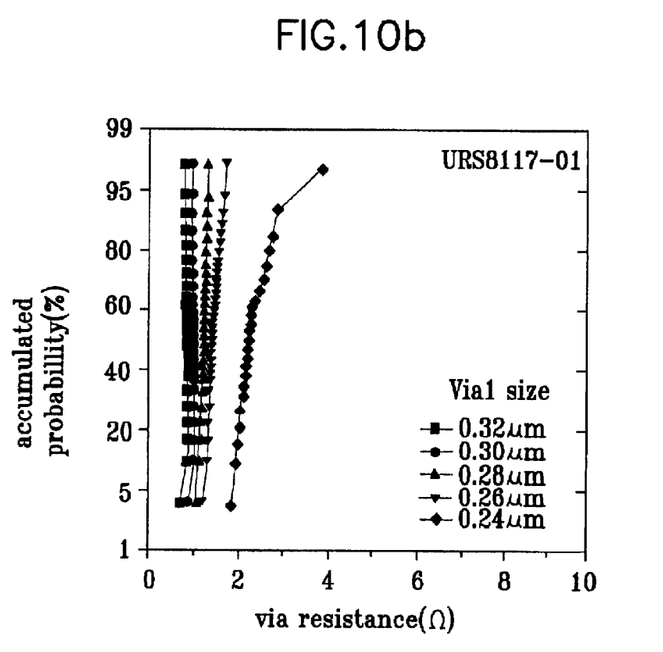

FIG. 10a shows via filling characteristic in case where IMP Ti is used as the barrier metal, and FIG. 10b shows via filling characteristic in case where IMP Ti/MOCVD TiN is used as the barrier metal.

Figure 10C:
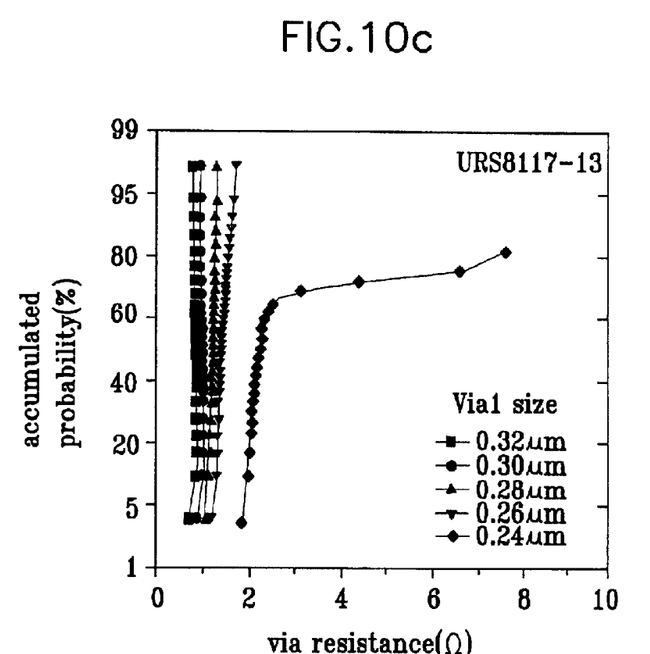
Figure 10D:
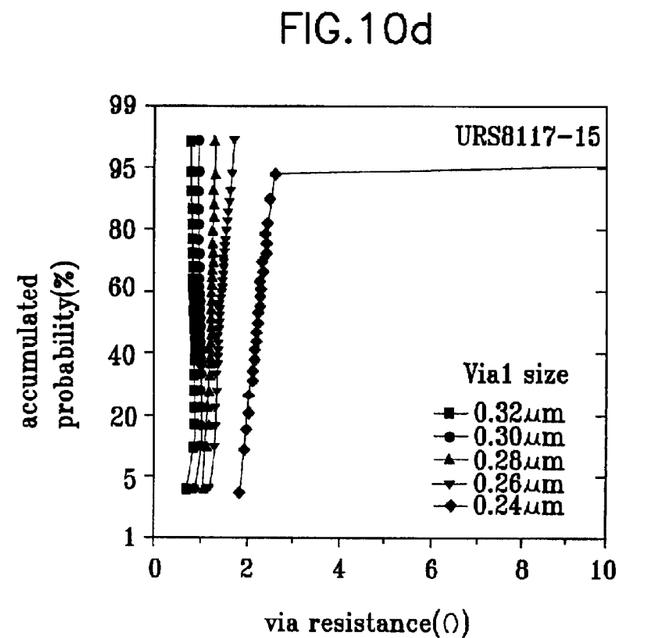

FIG. 10c shows via filling characteristic in case where IMP Ml is used as the barrier metal and the PVD Al seed layer is applied, and FIG. 10d shows via filling characteristic in case where IMP Ti/MOCVD TiN is used as the barrier metal and the PVD Al seed layer is applied.

It is noted that surface roughness of the Al thin film and <111> alignment characteristics can be improved without affecting Al filling characteristic in Ti/TiN substrate. It is also noted that surface roughness of the Al thin film, <111> alignment characteristics, and Al filling characteristic can be improved without affecting Al filling characteristic in a Ti/TiN substrate.

When forming the plug layer and the main line layer using the metal thin film, it doesn't matter whichever contact hole is used. Particularly, even if the contact hole is formed to have a vertical structure having an upper portion and a lower portion of the same width, it is possible to fulfill all the conditions of the metal line.

As aforementioned, the metal thin film and method for forming the same according to the present invention has the following advantages.

Since the barrier metal layer having the excellent aria filling characteristic is used, electromigration characteristic can be improved. Furthermore, since excellent step coverage and surface roughness can be maintained, reliability of wiring can be improved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art In the claims, means-plus-function clauses are intended to cover the structures described herein as performing the recited function and not only structural equivalents but also equivalent structures.

What is claimed is:

1. A method for forming a metal thin film of a semiconductor device comprising the steps of:
   forming an interleaving insulating film on a semiconductor substrate and selectively etching the interleaving insulating film to form a contact hole;
   forming a barrier metal layer on the interleaving insulating film including the contact hole;
   forming a PVD seed thin film on the barrier metal layer;
   forming a CVD thin film on the PVD seed thin film; and
   forming a PVD reflow thin film on the CVD thin film to fill the contact hole and form a flat thin film on the interleaving insulating film,
   wherein the PVD seed thin film and the CVD thin film are formed of the same material.

2. The method of claim 1, further comprising the step of cleaning an internal portion of the contact hole and a surface of the interleaving insulating film by cleaning process using plasma.

3. The method of claim 1, wherein the PVD seed thin film, the CVD thin film and the PVD reflow thin film are of the same material.

4. The method of claim 1, wherein the PVD seed thin film is formed of Al or Cu with a thickness of 2000 Å or less at a temperature of 300° C. or less and power of 5 kW or greater.

5. The method of claim 1, wherein the CVD thin film is formed at a thickness of 1000 Å or less, and in case where the CVD thin film is of Al, an organic compound, that includes one of dimethyl aluminum hydride (DMAH), $(CH_3)_2AlH$, dimethyl ethyl amine alane (DMEAA) and $AlH_3N(CH_3)_2(C_2H_5)$), and a first mixture material containing the organic metal compound is used as a precursor.

6. The method of claim 5, wherein the CVD thin film is formed at a deposition temperature of 150~300° C. and a deposition pressure of 1~100 Torr using a second mixture material in which adduct of a small amount is added to DMAH.

7. The method of claim 1, wherein the CVD thin film is formed at a thickness of 1000 Å or less, and in case where the CVD thin film is of Cu, one of a Lewis-base stabilizing Cu(I)beta-diketonate and a second mixture material containing the Lewis-base stabilizing Cu(I)beta-diketonate is used a precursor.

8. The method of claim 7, wherein the CVD thin film is formed at a deposition temperature of 100~300° C. and a deposition pressure of 1~100 Torr using a third mixture material in which tmvs and Hbfac Dihydrate (HDH) are added to Cu(hfac)(tmvs) as a compound precursor.

9. The method of claim 1, wherein, in case where the CVD thin film is formed of Al, the barrier metal layer is formed of Ti, TiN, or a combination of Ti and TiN, where Ti is deposited by ionized PVD process and TiN is deposited by ionized PVD or CVD process.

10. The method of claim 1, wherein, in case where the CVD thin film is formed of Cu, the barrier metal layer is formed of either any of Ta, TaN, a combination of Ta and TaN, TiN, and a combination of Ti and TiN, or WNx, where Ta and Ti are deposited by ionized PVD process while TaN, TiN and WNx are deposited by ionized PVD or CVD process.

11. The method of claim 1, wherein the PVD reflow thin film has a thickness less than 50% of the final thickness of the completed thin films.

12. The method of claim 1, wherein the PVD reflow thin film is formed by a deposition process performed at a temperature of at least 300° C. and one of a power of 5 kW so as to perform a subsequent annealing process, and a sequence of a first power of 5 kW or greater and a second power of 5 kW or less.

13. The method of claim 1, further comprising an ARC layer of a combination of Ti and TiN on the PVD reflow thin film.

* * * * *